United States Patent
Brunner et al.

[11] Patent Number: 6,115,262
[45] Date of Patent: Sep. 5, 2000

[54] ENHANCED MOUNTING PADS FOR PRINTED CIRCUIT BOARDS

[75] Inventors: Bjoern Erik Brunner, Dearborn; Vivek Amir Jairazbhoy, Farmington Hills; Richard Keith McMillan, Dearborn, all of Mich.

[73] Assignee: Ford Motor Company, Dearborn, Mich.

[21] Appl. No.: 09/093,025

[22] Filed: Jun. 8, 1998

[51] Int. Cl.[7] .................................. H05K 1/18; H05K 7/06
[52] U.S. Cl. .......................... 361/774; 361/760; 361/772; 361/777; 174/260; 174/261; 228/180.21
[58] Field of Search ..................................... 174/250, 260, 174/261, 263, 258; 228/179.1, 180.1, 180.21; 257/692, 723, 724, 700, 701, 773, 775, 778, 738, 737, 779, 780, 786; 361/760, 772, 774, 777, 779, 782, 783; 439/82, 68, 83; 438/108

[56] References Cited

U.S. PATENT DOCUMENTS

| | | | |
|---|---|---|---|
| 5,243,140 | 9/1993 | Bhatia et al. .......................... | 174/250 |
| 5,357,060 | 10/1994 | Yamashita ............................. | 361/777 |
| 5,381,307 | 1/1995 | Hertz et al. ........................... | 361/774 |
| 5,386,087 | 1/1995 | Lee et al. .............................. | 174/261 |
| 5,453,581 | 9/1995 | Liebman et al. ...................... | 174/261 |
| 5,670,750 | 9/1997 | Lauffer et al. ........................ | 174/262 |
| 5,683,788 | 11/1997 | Dugan et al. ......................... | 361/777 |
| 5,707,714 | 1/1998 | Furutatsu et al. .................... | 174/261 |
| 5,900,674 | 5/1999 | Wojnarowski et al. .............. | 361/774 |
| 5,961,737 | 10/1999 | Glenn .................................. | 228/179.1 |

FOREIGN PATENT DOCUMENTS

| | | | |
|---|---|---|---|
| 2837318 | 3/1980 | Germany ............................. | 174/261 |
| 3-4545 | 1/1991 | Japan . | |
| 8-195547 | 7/1996 | Japan . | |
| 11-87427 | 3/1999 | Japan . | |

*Primary Examiner*—Hyung-Sub Sough
*Assistant Examiner*—John B. Vigushin
*Attorney, Agent, or Firm*—Leslie C. Hodges

[57] ABSTRACT

There is disclosed herein a printed circuit board (PCB) having enhanced mounting pads useful for overprinting solder paste and for repair of the solder joints. The PCB comprises: a dielectric substrate 10 having at least one mounting pad 20 thereon, wherein each mounting pad is arranged in matched relation with a respective termination 32 of an electronic component 30. Each mounting pad 20 includes a main body portion 24 and one or more fingerlike extensions 26 extending outward from the main body portion and away from a projected footprint 34 of the electronic component.

21 Claims, 3 Drawing Sheets

ENHANCED MOUNTING PADS FOR PRINTED CIRCUIT BOARDS

BACKGROUND OF THE INVENTION

1. Field of the Invention

The present invention relates generally to printed circuit boards (PCBs), and more particularly to printed circuit boards having enhanced mounting pads thereon.

2. Disclosure Information

Surface-mount electronic components 30 are typically connected to printed circuit boards as illustrated in FIG. 1. First, a substrate 10 is provided which has a plurality of circuit traces 12 and mounting pads 20 thereon. The mounting pads 20 are arranged on the substrate 10 in matched relation with the terminations 32 of the electronic components 30 that are to be attached to the substrate. Next, depositions of solder paste 40 are placed atop each mounting pad 20, such as by screenprinting or dispensing, followed by placement of the components 30 atop the substrate such that each component termination 32 rests on the solder deposition 40 atop a respective mounting pad 20. Finally, the assembly is subjected to reflow soldering, laser soldering, or other processing so as to melt the solder depositions 40 and then allow them to cool to form solid solder joints 50 which mechanically and electrically connect each component termination 32 with its respective mounting pad 20.

The typical approach in depositing solder paste atop the mounting pads 20 is to deposit the paste in a 1:1 or less ratio with respect to each pad. For example, a rectangular 80×120-mil mounting pad may have a solder deposition thereatop that is a 50×90-mil rectangle generally centered atop the pad. However, the inventors of the present invention have discovered that it is advantageous in some applications to intentionally overprint the solder paste; that is, to deposit the solder in such a way that the deposition 40 extends outside the outer edges 22 of the mounting pad, as illustrated in FIG. 2. This is done, for example, to promote the formation of certain solder joint shapes during reflow.

Although overprinting provides certain advantages, it presents certain problems as well. One problem is that when using conventional, industry-standard design rules for circuit board construction, the overprinted solder deposition 40 extends partly atop the solder mask 14 which typically surrounds each mounting pad 20. (The solder mask 14 is a non-solder-wettable layer used on most PCBs for covering essentially all of the substrate surface, except for apertures 16 that are formed therein located about each mounting pad 20, as illustrated in FIGS. 1–2. The edges 18 of each aperture 16 are generally spaced outward from the corresponding mounting pad edges 22 by a certain distance P, called the "solder mask pullback"; for screenprinted solder mask, the pullback P is typically 10–20 mils, whereas for liquid photoimageable solder mask (LPISM) the pullback is typically 0–5 mils.) When the solder paste deposition 40 extends beyond the mounting pad edges 22 and onto the surrounding solder mask 14 as illustrated in FIGS. 3–4 (or, when no solder mask is used, onto the top surface of the surrounding bare substrate 10), there is a tendency to form solder balls 60 that are separate from the solder joint 50. The formation of solder balls 60 is undesirable for at least two reasons: (1) solder balls 60 take solder away from the solder joint 50, which often affects the joint 50 detrimentally, and (2) the solder balls 60 may roll across the substrate/solder mask and lodge between adjacent pads/terminations/joints, thereby causing unwanted solder bridges and short-circuits. These problems are presented regardless of whether the substrate 10 has a solder mask layer 14 thereon.

It would be desirable, therefore, to provide a way of allowing overprinting without the aforementioned drawbacks.

SUMMARY OF THE INVENTION

The present invention overcomes the disadvantages of the prior art approaches by providing a printed circuit board having enhanced mounting pads useful for solder paste overprinting. The PCB comprises: a dielectric substrate having at least one mounting pad thereon, wherein each mounting pad is arranged in matched relation with a respective termination of an electronic component. Each mounting pad includes a main body portion and one or more fingerlike extensions extending outward from the main body portion and away from a projected footprint of the electronic component. A method for overprinting using this construction is also disclosed, as is a method for repairing a PCB having this construction.

It is an object and advantage that the present invention helps to minimize solder ball formation when overprinting solder paste.

Another advantage is that the present invention may be readily and inexpensively used with conventional circuit board designs.

These and other advantages, features and objects of the invention will become apparent from the drawings, detailed description and claims which follow.

DETAILED DESCRIPTION OF THE PREFERRED EMBODIMENTS

Figure 5:
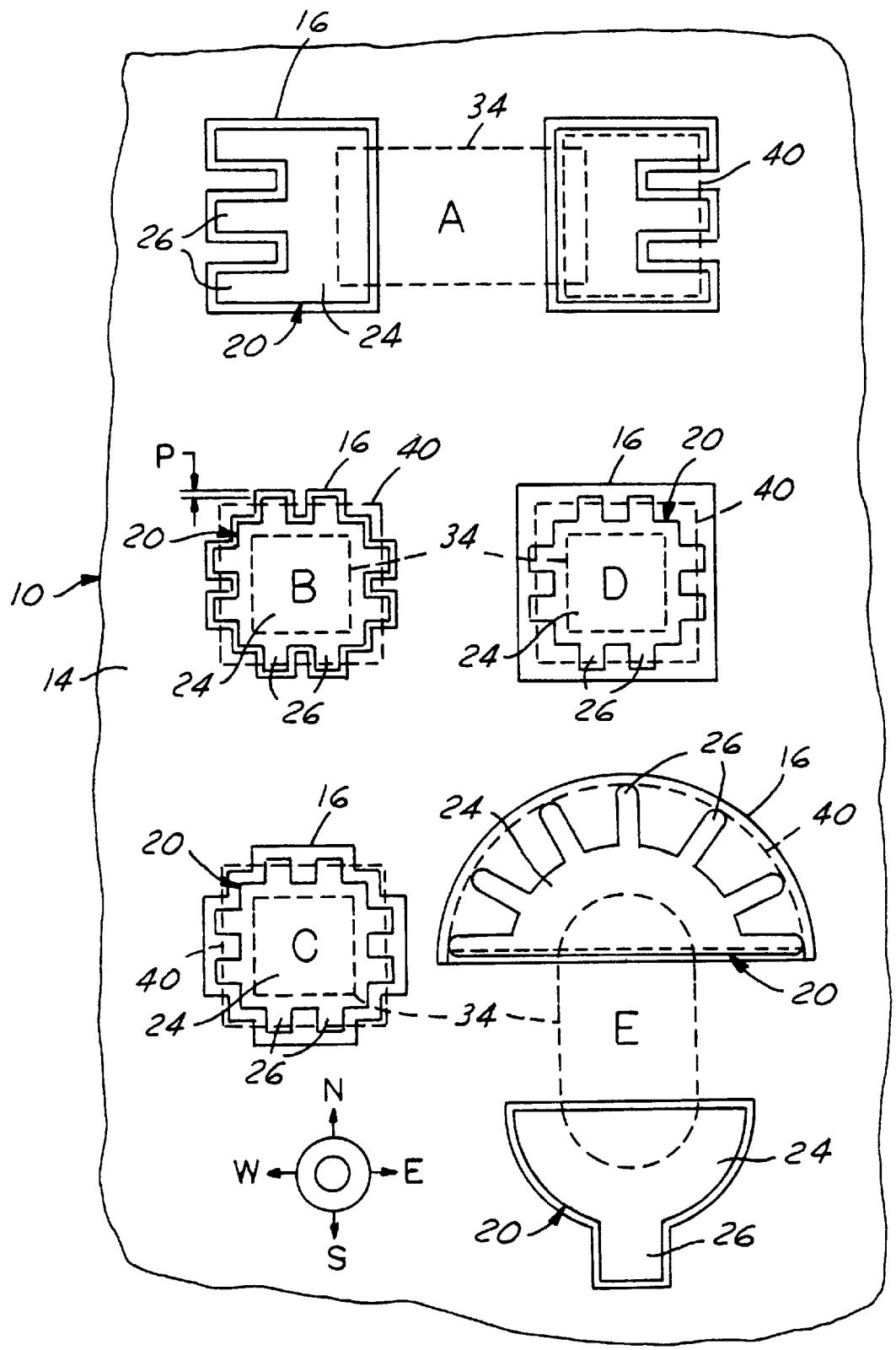
FIGS. 5–6 are plan views of various mounting pad configurations according to the present invention.
Figure 6:
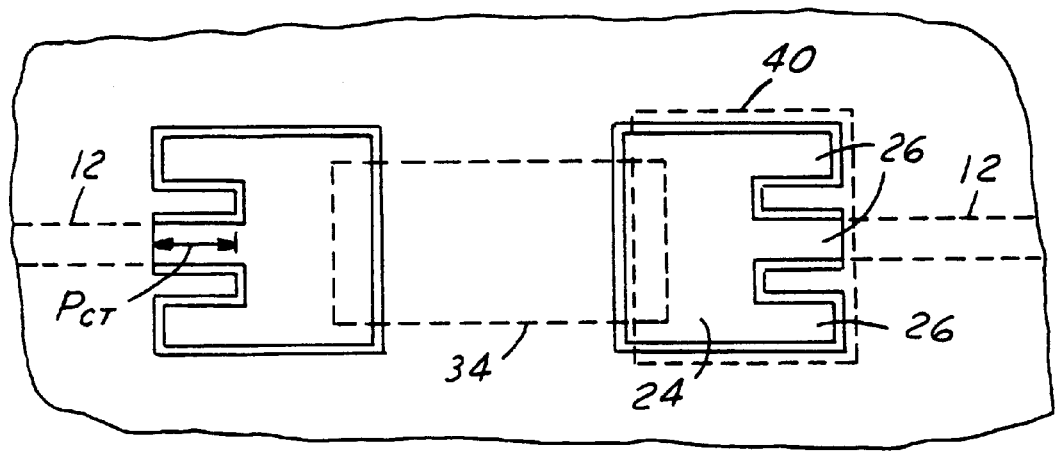
Figure 8:
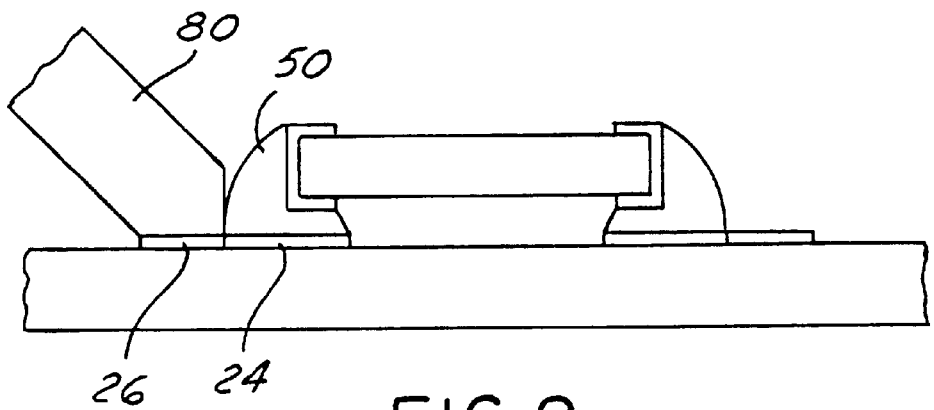

Referring now to the drawings, FIGS. 5–6 and 8 show a printed circuit board having enhanced mounting pads according to the present invention, useful for overprinting solder paste and for repair of the solder joints. The PCB comprises: a dielectric substrate 10 having at least one mounting pad 20 thereon, wherein each mounting pad is arranged in matched relation with a respective termination 32 of an electronic component 30. Each mounting pad 20 includes a main body portion 24 and one or more fingerlike extensions 26 extending outward from the main body portion and away from a projected footprint 34 of the electronic component.

To assist the reader in understanding the present invention, all reference numbers used herein are summarized in the table below, along with the elements they represent:

10=Substrate
12=Circuit trace
14=Solder mask
16=Aperture in solder mask
18=Edges of aperture
20=Mounting pad
22=Edges of mounting pad
24=Main body portion of mounting pad
26=Fingerlike extension of mounting pad
30=Electronic component 32=Termination of component 34=Footprint of component (projected on substrate)

40=Solder paste deposition (outline)

50=Solder joint

60=Solder ball

80=Tip of soldering iron

P=Pullback of solder mask edge from pad edge $P_{CT}$=Pullback of solder mask from pad edge atop circuit trace Those skilled in the art will recognize that the mounting pad configurations of the present invention, as well as the methods (disclosed below) for using such configurations for overprinting and/or solder joint repair, are unique with respect to the prior art. Each mounting pad 20 includes one main body portion 24 that is generally the same size and shape as an entire prior art mounting pad using conventional PCB design rules. Typically, the main body portion 24 may be generally round, rectangular, or semi-circular, with rectangular being the most preferred shape.

Figure 1:
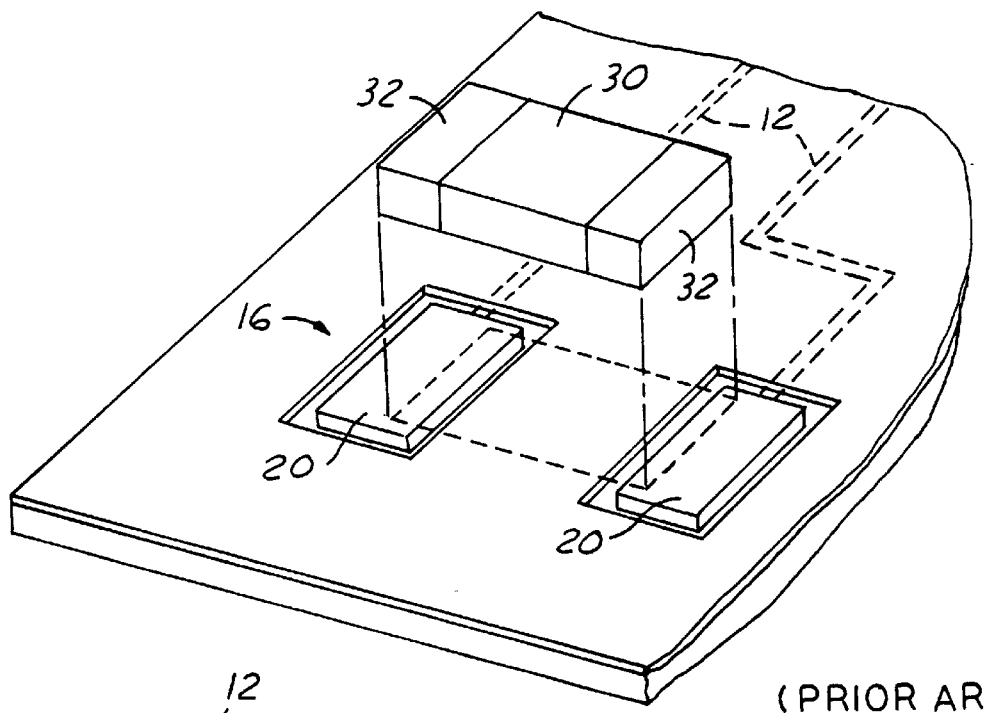
FIGS. 1–2 are perspective and plan views, respectively, of a printed circuit board according to the prior art.
Figure 2:
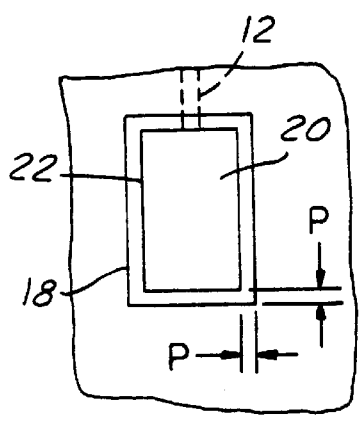
Figure 3:
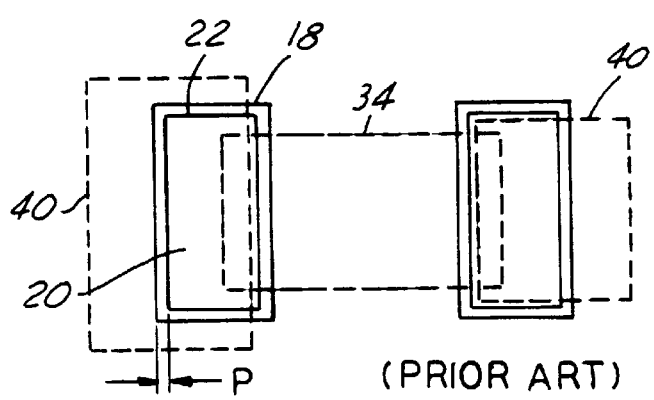
FIG. 3 is a plan view of overprinted substrate mounting pads according to the prior art.
Figure 4:
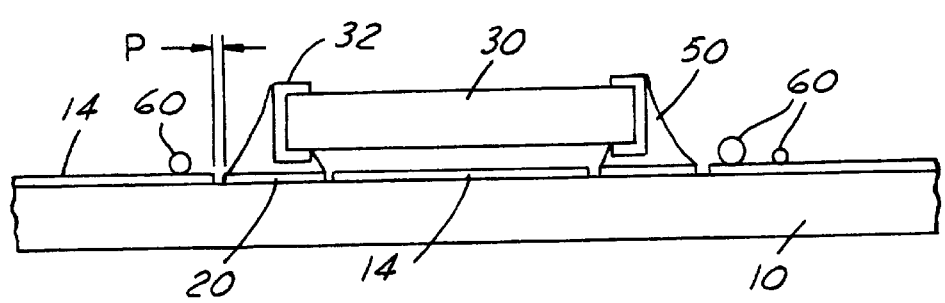
FIG. 4 is a side view of a populated, overprinted PCB after reflow according to the prior art.

The main body portion 24 is positioned with respect to the component 30 and its terminations 32 in the same way that a corresponding prior art pad would be; this may be seen more clearly by referring to FIGS. 3 and 5. FIG. 3 shows a mounting pad configuration for a bi-terminated component (wherein each of the two mounting pads 20 has been overprinted differently, for purpose of illustration). In FIG. 5, configuration "A" illustrates a mounting pad arrangement for the same bi-terminated component as in FIG. 3. Note that (1) the size and shape of the pads 20 and (2) the orientation of the pads 20 with respect to the component footprint 34, in FIG. 3, is essentially the same as (1) the size and shape of the main body portion 24 and (2) the orientation of the main body portion 24 with respect to the component footprint 34, in configuration "A" of FIG. 5. However, the pads 20 in FIG. 5 further include one or more fingerlike extensions 26 extending outward from the main body portion 24 and away from the projected component footprint 34. Also note that the component footprint 34 overlaps each main body portion 24, but not any of the fingerlike extensions 26.

Configurations "B", "C", and "D" in FIG. 5 illustrate various mounting pad configurations for single-terminated components according to the present invention. Such a component 30 might be a power transistor, which has a single metallized bottom surface which is soldered onto a substrate mounting pad 20, and two aluminum I/O bond pads on the top of the transistor which may be wirebonded to an adjacent leadframe (not shown). The configurations shown here are generally square pads 20 having two fingerlike extensions 26 on each side thereof. For single-terminated components, the footprint 34 is in the middle of the pad 20, with the fingerlike extensions 26 extending outward therefrom. Note that in configuration "B" the solder mask edges 16 hug each pad extension 26 with a generally uniform pullback P between each pad edge 22 and each corresponding mask edge 18; this provides castellations along each edge 18 of the solder mask 14. ("Castellations" are an alternating tab-and-notch configuration, similar to the shape of a square-wave pattern or to the traditional block pattern atop castle towers.) In configuration "C", the four major mask edges (corresponding to the N, S, E, and W directions per the directional indicator in FIG. 5) are not castellated; rather, each of these mask edges 18 is straight. And in configuration "D", the solder mask aperture 16 is generally square and concentric with the square main body portion 24 and is completely non-castellated. This particular non-castellated (i.e., "nonhugging") aperture configuration is similar to that shown in configuration "E", where the main body portion 24 of the N pad 20 is generally semi-circular, as is the shape of the corresponding aperture 16. In each configuration shown, it may be noted that each fingerlike extension 26 extends away from its main body portion 24 and away from the component footprint 34 associated therewith.

As illustrated in FIG. 6, one of the fingerlike extensions 26 for each mounting pad 20 may comprise a circuit trace 12 attached to the pad. However, it is preferable that the solder mask pullback PCT atop the circuit trace be such that the exposed length of circuit trace be generally equivalent to the length of the other extension(s) 26.

The foregoing pad configurations may be used for improved overprinting as follows. First, a PCB/substrate is provided having one or more of the aforementioned mounting pad configurations; for illustration purposes, configuration "A" of FIG. 5 will be referred to hereafter. Second, solder paste is deposited on each mounting pad 20 in a single deposition 40 so as to cover substantially all of the main body portion 24, substantially all of each fingerlike extension 26, and substantially all of the PCB surface adjacent each extension 26, as illustrated by the solder deposition outline 40 in each configuration of FIG. 5. The PCB surface about each extension 26 may be mostly solder mask 14, as in configurations "A" and "B", or may be mostly solder-mask-free substrate 10, as in configuration "D" and the N pad of configuration "E". (The substrate 10 may also be completely or substantially free of any solder mask layer 14 thereon.) Third, the PCB may be subjected to reflow heating, laser soldering, or any other known processing approach for melting the solder paste, followed by a fourth step of cooling the molten solder to form a solid solder joint 50 atop each main body portion 24.

As the solder paste melts, surface tension forces within the molten solder will cause the solder to transform from a flat deposition of paste to a taller molten glob whose footprint is smaller than the original paste deposition footprint. As the solder melts, the outer edges of the molten glob will wick inward along the solder-wettable fingerlike extensions 26 toward the main body portion 24; the solder atop the non-solder-wettable solder mask or bare substrate surface between and about the fingers 26 is pulled along toward the main body portion 24. It has been found that providing the fingerlike extensions 26 is better than the prior art approaches at causing the overprinted solder to form a solder joint 50 atop the main body portion 24 while avoiding the formation of solder balls 60.

In addition to the mitigation of solder ball formation provided by the present invention, another advantage and benefit of the mounting pad configurations disclosed herein is the ability to effect solder joint repair and rework in a way much improved over prior art approaches. This is true regardless of whether the PCB utilizes solder paste overprinting.

Figure 7:
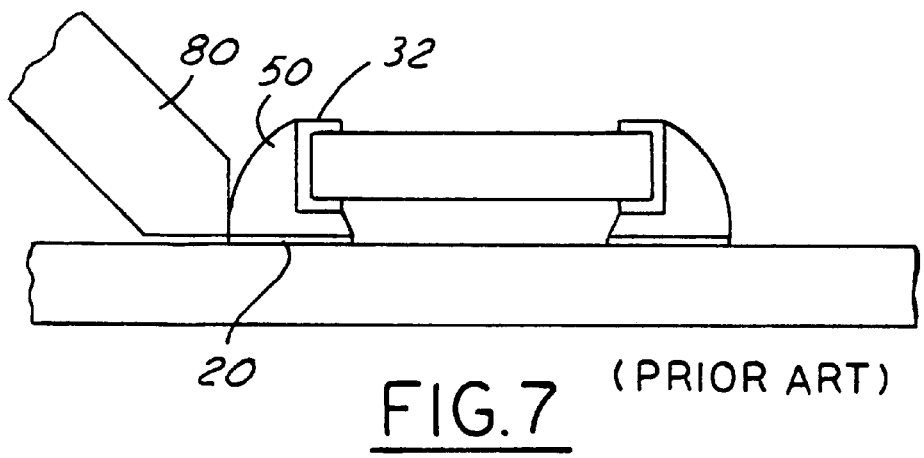
FIGS. 7–8 are side views of a PCB being reworked according to the prior art and the present invention, respectively.

As illustrated in FIG. 7, re-melting a solder joint 50 using a soldering iron 80 may be difficult, particularly for small components and/or when the mounting pad 20 is substantially "hidden" underneath the solder joint 50 or the component terminations 32. However, when one or more extensions 26 are provided as described above, the tip 80 of a soldering iron may be placed not only against the joint 50 but also atop one or more extensions 26, thereby transferring more heat per given time to the joint 50 than can be done using the prior art mounting pad configurations.

Various modifications to the present invention may occur to those skilled in the art to which the present invention pertains. For example, the PCB described herein may further comprise (1) an electronic component having terminations, wherein each termination is disposed above a respective one of the one or more mounting pads, as well as (2) a solder joint connecting each termination with its respective mounting pad. Also, although the terms "solder paste", "solder joint", and the like have been used herein to describe the bonding material which forms a mechanical and electrical joint between each component termination and its respective mounting pad, it is possible to substitute a conductive adhesive (e.g., silver-filled epoxy) for the solder paste, and to use reflow heating, laser heating/curing, infrared or ultraviolet energy, and other methods to cure and/or form the desired joint 50. Other modifications not explicitly mentioned herein are also possible and within the scope of the present invention. It is the following claims, including all equivalents, which define the scope of the present invention.

What is claimed is:

1. A printed circuit board, comprising:
   a dielectric substrate having at least one mounting pad thereon, wherein each mounting pad is arranged in a matched relation with a respective termination of an electric component,
   wherein said at least one mounting pad includes a main body portion and a plurality of fingerlike extensions, each of said plurality of fingers having a longitudinal dimension and a transverse dimension, said extensions extending outward from said main body portion and away from and not coextensive with a projected footprint of the electronic component, said longitudinal dimension greater than said transverse dimension.

2. A printed circuit board according to claim 1, wherein said main body portion of said at least one mounting pad is generally round, rectangular, or semi-circular.

3. A printed circuit board according to claim 1, wherein one of said one or more fingerlike extensions comprises a circuit trace disposed on said substrate.

4. A printed circuit board according to claim 1, further comprising a solder mask disposed on said substrate and having at least one aperture formed therein, wherein each aperture is situated about a respective one of said at east one mounting pad.

5. A printed circuit board according to claim 4, wherein each aperture generally conforms in shape with its respective mounting pad and is spaced apart therefrom by a predetermined pullback distance.

6. A printed circuit board according to claim 5, wherein said predetermined pullback distance is generally between 0 and 20 mils.

7. A printed circuit board according to claim 4, wherein each aperture is generally rectangular or semi-circular and is non-castellated about said one or more fingerlike projections, and wherein each aperture generally conforms in shape and is generally concentric with its respective main body portion.

8. A printed circuit board according to claim 1, wherein the component footprint overlaps each main body portion and none of said one or more fingerlike extensions.

9. A printed circuit board according to claim 1, further comprising:
   (a) an electronic component having terminations thereon, wherein each termination is disposed atop a respective one of said at least one mounting pad, and (b) a solder joint connecting each termination with its respective mounting pad.

10. A printed circuit board according to claim 1, wherein said longitudinal dimension is at least 1.5 times greater than said transverse dimension.

11. A printed circuit board according to claim 1, wherein each of said plurality of fingers extends from a position other than a corner of said mounting pad.

12. A printed circuit board, comprising: a dielectric substrate having at least one mounting pad thereon, wherein said at least one mounting pad is arranged in a matched relation with a respective termination of an electric component, and
   a solder mask disposed on said substrate and having at least one aperture formed therein, wherein each aperture is situated about a respective one of said at least one mounting pad,
   wherein each mounting pad includes a generally rectangular main body portion and a plurality of fingerlike extensions, each of said plurality of fingerlike extensions having a longitudinal dimension and a transverse dimension, said extensions extending outward from said main body portion and away from and not coextensive with a projected footprint of the electronic component, said longitudinal dimension greater than said transverse dimension.

13. A printed circuit board according to claim 12, wherein one of said fingerlike extensions comprises a circuit trace disposed on said substrate.

14. A printed circuit board according to claim 12, wherein each aperture generally conforms in shape with its respective mounting pad and is spaced apart therefrom by a predetermined pullback distance.

15. A printed circuit board according to claim 14, wherein said predetermined pullback distance is generally between 0 and 20 mils.

16. A printed circuit board according to claim 12, wherein each aperture is generally rectangular and is not castellated about said fingerlike projections, and wherein each aperture generally conforms in shape and is generally concentric with its respective main body portion.

17. A printed circuit board according to claim 12, wherein the component footprint overlaps each main body portion and none of said fingerlike extensions.

18. A printed circuit board according to claim 12, further comprising:
   (a) an electronic component having terminations thereon, wherein each termination is disposed atop a respective one of said at least one mounting pad, and
   (b) a solder joint connecting each termination with its respective mounting pad.

19. A printed circuit board according to claim 12, wherein said longitudinal dimension is at least 1.5 times greater than said transverse dimension.

20. A printed circuit board according to claim 12, wherein each of said plurality of fingers extends from a position other than a corner of said mounting pad.

21. A printed circuit board, comprising:
   a dielectric substrate having at least one mounting pad thereon, wherein each mounting pad is arranged in a matched relation with a respective termination of an electric component,
   wherein each mounting pad includes a main body portion and at least three fingerlike extensions spaced apart from each other and extending outward from said main body portion and away from a projected footprint of the electronic component, wherein said projected footprint is non-intersecting and non coextensive with said fingerlike extensions, only one of said fingerlike extensions electrically functioning as an electrical interconnection.

* * * * *